US011936179B2

(12) United States Patent
Mao et al.

(10) Patent No.: US 11,936,179 B2
(45) Date of Patent: Mar. 19, 2024

(54) ELECTROSTATIC DISCHARGE PROTECTION CIRCUIT

(71) Applicant: CHANGXIN MEMORY TECHNOLOGIES, INC., Hefei (CN)

(72) Inventors: Pan Mao, Hefei (CN); Yingtao Zhang, Hefei (CN); Junjie Liu, Hefei (CN); Lingxin Zhu, Hefei (CN); Bin Song, Hefei (CN); Qi'an Xu, Hefei (CN); Tieh-Chiang Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 128 days.

(21) Appl. No.: 17/810,235

(22) Filed: Jun. 30, 2022

(65) Prior Publication Data

US 2023/0291199 A1 Sep. 14, 2023

Related U.S. Application Data

(63) Continuation of application No. PCT/CN2022/087596, filed on Apr. 19, 2022.

(30) Foreign Application Priority Data

Mar. 11, 2022 (CN) ......................... 202210243354.3

(51) Int. Cl.
*H02H 9/04* (2006.01)
*H01L 27/02* (2006.01)

(52) U.S. Cl.
CPC ......... *H02H 9/046* (2013.01); *H01L 27/0255* (2013.01); *H01L 27/0259* (2013.01); *H01L 27/0288* (2013.01); *H01L 27/0292* (2013.01)

(58) Field of Classification Search
CPC . H02H 9/046; H01L 27/0255; H01L 27/0259; H01L 27/0288; H01L 27/0292
USPC ........................................................... 361/56
See application file for complete search history.

(56) References Cited

U.S. PATENT DOCUMENTS 5,359,211 A * 10/1994 Croft .................. H01L 27/0259 257/362
6,635,931 B1 * 10/2003 Wang ...................... H01L 24/05 257/361
7,672,103 B2 3/2010 Moon
8,035,937 B2 10/2011 Kwak
8,189,308 B2 5/2012 Lim
(Continued)

FOREIGN PATENT DOCUMENTS

CN 1808716 A 7/2006
CN 101174622 A 5/2008
(Continued)

*Primary Examiner* — Kevin J Comber
(74) *Attorney, Agent, or Firm* — Syncoda LLC; Feng Ma

(57) ABSTRACT

A discharge unit is connected to a power pad, a ground pad, and an I/O pad, and can discharge an electrostatic charge when an electrostatic pulse appears on any of the power pad, the ground pad, and the I/O pad. The discharge unit includes a first discharge unit and a second discharge unit, the first discharge unit is connected to the second discharge unit, the power pad, and the I/O pad, and the second discharge unit is connected to the ground pad and the I/O pad. The first discharge unit and/or the second discharge unit can discharge electrostatic charges on different pads, respectively.

15 Claims, 5 Drawing Sheets

VDD
101
100
R1
Q3
Q1
Q2
R2
I/O
102
R3
Q4
103
BJT
N
Trigger unit
Q5
R4
VSS

(56) References Cited

U.S. PATENT DOCUMENTS

| | | | | |
|---|---|---|---|---|
| 2002/0109950 | A1 * | 8/2002 | Marr | H02H 9/046 361/56 |
| 2006/0091464 | A1 * | 5/2006 | Hiraoka | H01L 27/0262 257/355 |
| 2009/0201616 | A1 | 8/2009 | Moon | |
| 2009/0323237 | A1 | 12/2009 | Kwak | |
| 2010/0165524 | A1 | 7/2010 | Lim | |
| 2021/0359511 | A1 | 11/2021 | Xu | |

FOREIGN PATENT DOCUMENTS

| | | | |
|---|---|---|---|
| CN | 101882616 | A | 11/2010 |
| CN | 112885816 | A | 6/2021 |
| WO | 2021227584 | A1 | 11/2021 |

* cited by examiner

ELECTROSTATIC DISCHARGE PROTECTION CIRCUIT

CROSS-REFERENCE TO RELATED APPLICATIONS

This is a continuation of International Patent Application No. PCT/CN2022/087596 filed on Apr. 19, 2022, which claims priority to Chinese Patent Application No. 202210243354.3 filed on Mar. 11, 2022. The disclosures of these applications are hereby incorporated by reference in their entirety.

BACKGROUND

Static electricity is everywhere. If there is no Electrostatic Discharge (ESD) protection circuit, a chip may be damaged soon by static electricity introduced by various reasons, and may almost be fatally hit by one blow. With the continuous development of semiconductor integration technology, feature sizes of semiconductor devices are getting smaller and smaller, and ESD has an increasing impact on the semiconductor devices.

Therefore, an ESD protection circuit is generally provided in a chip. The ESD protection circuit is used to discharge an electrostatic charge in time to prevent a protected circuit from failing or even burning due to a high voltage caused by the electrostatic charge.

SUMMARY

The disclosure relates to, but is not limited to, an Electrostatic Discharge (ESD) protection circuit.

In a first aspect, the disclosure provides an ESD protection circuit in a chip. The chip includes a power pad, a ground pad, and an input/output (I/O) pad, and the ESD protection circuit includes a discharge unit.

The discharge unit is connected to the power pad, the ground pad, and the I/O pad.

The discharge unit is configured to discharge an electrostatic charge when an electrostatic pulse appears on any of the power pad, the ground pad, and the I/O pad.

The discharge unit includes a first discharge unit and a second discharge unit. The first discharge unit is connected to the second discharge unit, the power pad, and the I/O pad, and the second discharge unit is connected to the ground pad and the I/O pad.

BRIEF DESCRIPTION OF THE DRAWINGS

The accompanying drawings, which are incorporated in and constitute a part of the description, illustrate embodiments in line with the disclosure and, together with the description, serve to explain the principles of the disclosure.

The foregoing accompanying drawings have shown specific embodiments of the disclosure, which will be described in greater detail hereinafter. The accompanying drawings and written description are not intended to limit the scope of the disclosure in any way, but rather to illustrate the concept of the disclosure to a person skilled in the art by referring to specific embodiments.

DETAILED DESCRIPTION

Exemplary embodiments will be described in detail herein, examples of which are illustrated in the accompanying drawings. The following description refers to the accompanying drawings in which the same reference numbers in different drawings represent the same or similar elements unless specifically stated otherwise. The implementations described in the following exemplary embodiments do not represent all implementations consistent with the disclosure. Instead, they are merely examples of apparatuses and methods consistent with aspects related to the disclosure as recited in the appended claims.

A person skilled in the art can easily figure out other implementations of the disclosure after considering the description and practicing the invention disclosed herein. The disclosure is intended to cover any variations, functions, or adaptive changes of the disclosure. These variations, functions, or adaptive changes comply with general principles of the disclosure, and include common general knowledge or common technical means in the technical field that are not disclosed in the disclosure. The description and embodiments are merely considered to be exemplary, and the true scope and spirit of the disclosure should be indicated by the appended claims.

Figure 1:
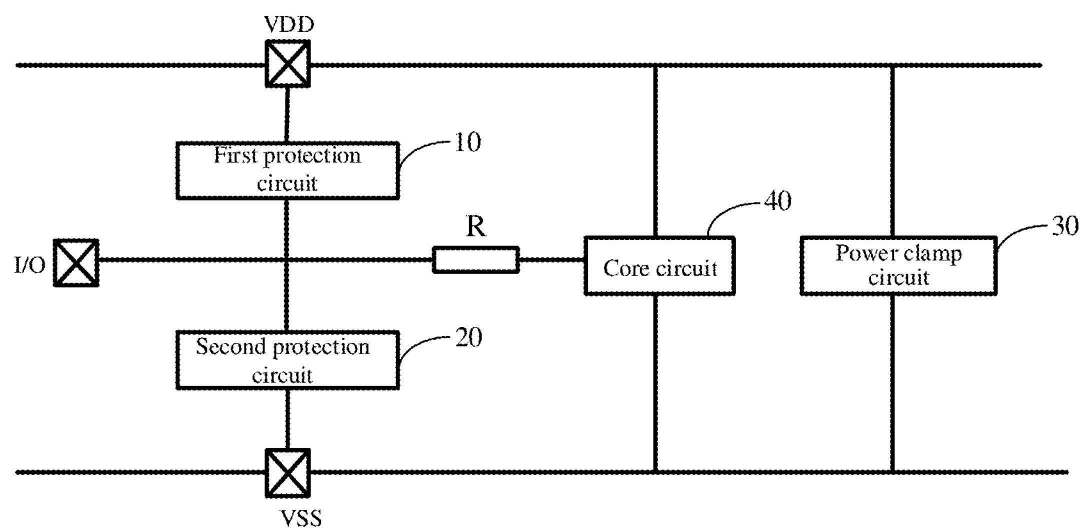
FIG. 1 is a specific circuit diagram of an ESD protection circuit according to an embodiment of the disclosure.

FIG. 1 is a circuit diagram of an ESD protection circuit of a chip according to an embodiment of the disclosure. As shown in FIG. 1, an embodiment of the disclosure provides an ESD protection circuit. A chip includes a power pad VDD, a ground pad VSS, and an input/output (I/O) pad. A core circuit 40 provided in the chip is connected to the power pad VDD, the ground pad VSS, and the I/O pad. The ESD protection circuit includes a first protection circuit 10, a second protection circuit 20, and a power clamp circuit 30.

The first protection circuit 10 is located between the power pad VDD and the I/O pad, the second protection circuit 20 is located between the ground pad VSS and the I/O pad, and the power clamp circuit 30 is located between the power pad VDD and the ground pad VSS. The first protection circuit 10 and the second protection circuit 20 each includes a unidirectional protection device, such as a diode, and the power clamp circuit 30 includes a transistor.

The first protection circuit 10 includes a first unidirectional protection device, and a conduction direction of the first unidirectional protection device is a direction from the I/O pad to the power pad VDD. The second protection circuit 20 includes a second unidirectional protection device, and the conduction direction of the second unidirectional protection device is a direction from the VSS pad to the I/O pad.

When there is an electrostatic pulse on the power pad VDD, ESD is performed in a VDD-VSS discharge mode, so that an electrostatic charge on the power pad VDD is discharged to the ground pad VSS through the power clamp circuit 30. When there is an electrostatic pulse on the ground pad VSS, ESD is performed in a VSS-VDD mode, so that an electrostatic charge on the ground pad is discharged to the power pad VDD through the second protection circuit 20 and the first protection circuit 10.

When there is a positive voltage pulse relative to the power pad VDD on the I/O pad, ESD is performed in a Positive to VDD (PD) mode, that is, a discharge path from the I/O pad to the power pad VDD is formed. The discharge path passes through the first protection circuit 10, so that a positive charge on the I/O pad is discharged to the power pad VDD through the first protection circuit 10.

When there is a negative voltage pulse relative to the power pad VDD on the I/O pad, ESD is performed in a Negative to VDD (ND) mode, that is, a discharge path from the power pad VDD to the I/O pad is formed. The discharge path passes through the power clamp circuit 30 and the second protection circuit 20, so that a positive charge on the power pad VDD flows to the I/O pad through the power clamp circuit 30 and the second protection circuit 20 to discharge a negative charge on the I/O pad.

When there is a positive voltage pulse relative to the ground pad VSS on the I/O pad, ESD is performed in a Positive to VSS (PS) mode, that is, a discharge path from the I/O pad to the ground pad VSS is formed. The discharge path passes through the first protection circuit 10 and the power clamp circuit 30, so that a positive charge on the I/O pad is discharged to the ground pad VSS through the first protection circuit 10 and the power clamp circuit 30.

When there is a negative voltage pulse relative to the ground pad VSS on the I/O pad, ESD is performed in a Negative to VSS (NS) mode, that is, a discharge path from the ground pad VSS to the I/O pad is formed. The discharge path passes through the second protection circuit 20, so that a positive charge on the ground pad VSS flows to the I/O pad through the second protection circuit 20 to discharge a negative charge on the I/O pad.

Figure 2:
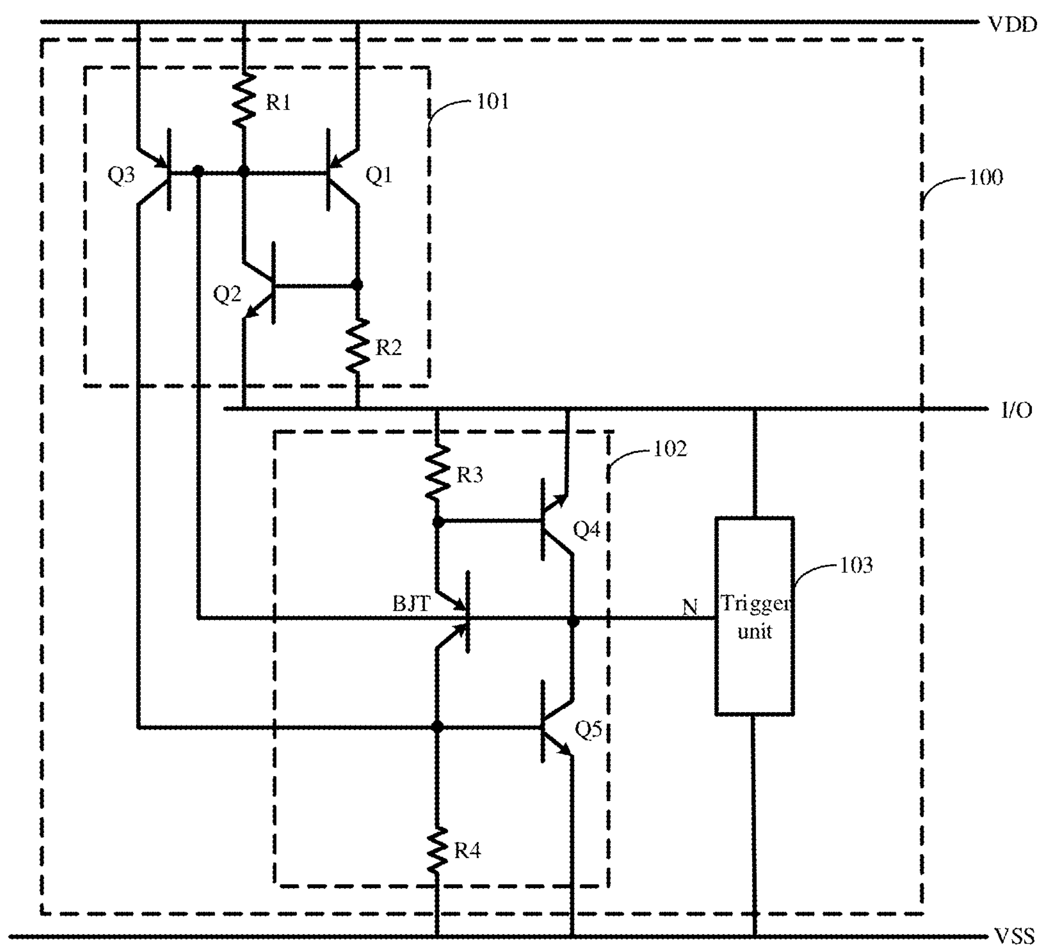
FIG. 2 is a specific circuit diagram of an ESD protection circuit according to another embodiment of the disclosure.
Figure 3:
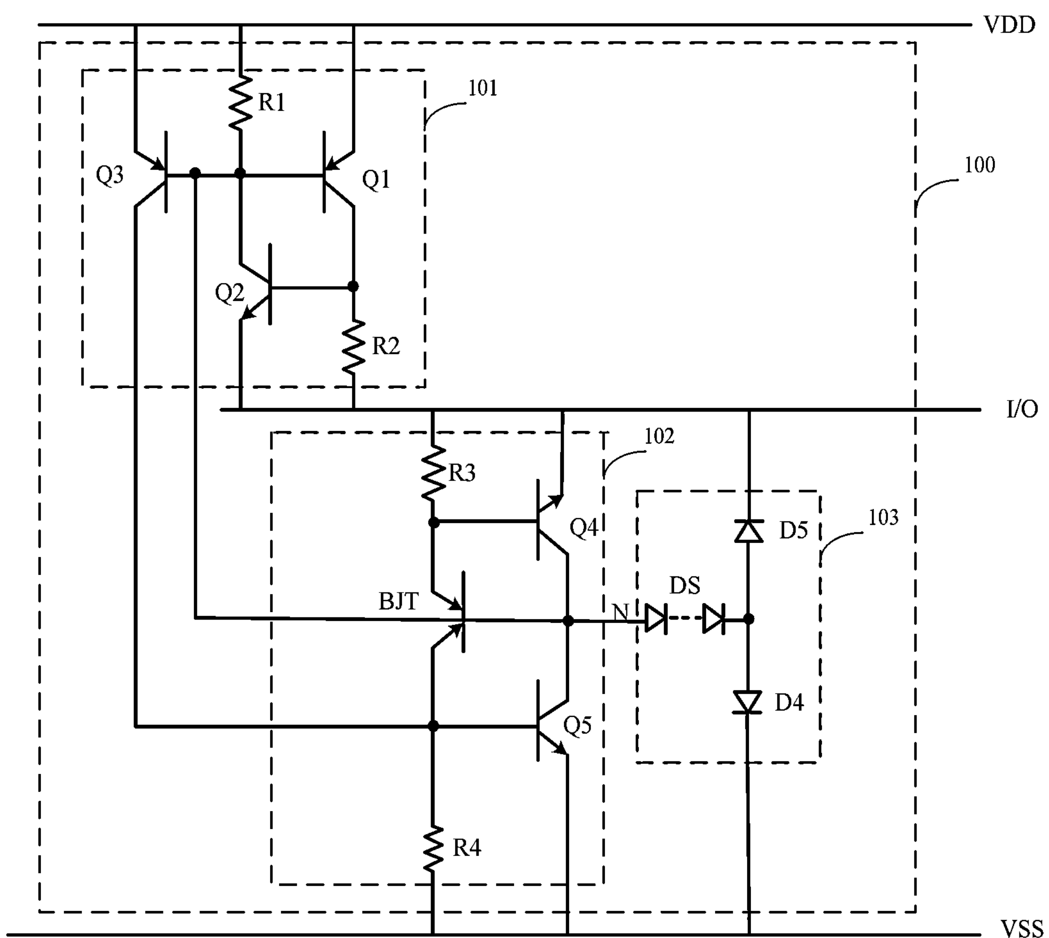
FIG. 3 is a specific circuit diagram of an ESD protection circuit according to another embodiment of the disclosure.

FIG. 2 and FIG. 3 are circuit diagrams of an ESD protection circuit of a chip according to an embodiment of the disclosure. As shown in FIG. 2 and FIG. 3, an embodiment of the disclosure provides an ESD protection circuit. A chip includes a power pad VDD, a ground pad VSS, and an I/O pad. A core circuit provided in the chip is connected to the power pad VDD, the ground pad VSS, and the I/O pad. The ESD protection circuit includes a discharge unit 100. The discharge unit 100 includes a first discharge unit 101 and a second discharge unit 102.

The discharge unit 100 is connected to the power pad VDD, the ground pad VSS, and the I/O pad, and can discharge an electrostatic charge when there is an electrostatic pulse on any of the power pad VDD, the ground pad VSS, and the I/O pad. The first discharge unit 101 is connected to the second discharge unit 102, the power pad VDD, and the I/O pad. The second discharge unit 102 is connected to the ground pad VSS and the I/O pad. The first discharge unit 101 and/or the second discharge unit 102 discharge electrostatic charges on different pads, respectively.

When there is an electrostatic pulse on the power pad VDD, an electrostatic charge is discharged to the ground pad VSS through the first discharge unit 101 and the second discharge unit 102. When there is an electrostatic pulse on the ground pad VSS, an electrostatic charge is discharged to the power pad VDD through the second discharge unit 102 and the first discharge unit 101. When there is a positive voltage pulse relative to the power pad VDD on the I/O pad, a positive charge is discharged to the power pad VDD through the second discharge unit 102 and the first discharge unit 101. When there is a negative voltage pulse relative to the power pad VDD on the I/O pad, a negative charge is discharged to the VDD pad through the first discharge unit 101. When there is a positive voltage pulse relative to the ground pad VSS on the I/O pad, a positive charge is discharged to the ground pad VSS through the second discharge unit 102. When there is a negative voltage pulse relative to the ground pad VSS on the I/O pad, a negative charge is discharged to the ground pad VSS through the second discharge unit 102. The electrostatic charge on any of the pads can be discharged through the first discharge unit 101 between the power pad VDD and the I/O pad and/or the second discharge unit 102 between the ground pad VSS and the I/O pad, thereby improving a discharge capability of the ESD protection circuit, reducing an area occupied by the ESD protection circuit in the chip, and reducing the chip cost. Moreover, when the electrostatic charge on any of the pads is discharged through the first discharge unit 101 and/or the second discharge unit 102, a resulting discharge path is short, thereby improving the robustness.

In an embodiment, a current limiting resistor R is provided between the core circuit 40 and the I/O pad to prevent an electrostatic pulse on the I/O pad from damaging a device in the core circuit 40.

As shown in FIG. 2 and FIG. 3, the first discharge unit 101 includes a first discharge transistor Q1, a second discharge transistor Q2, and a third discharge transistor Q3. An emitter of the first discharge transistor Q1 is connected to the power pad VDD, a base of the second discharge transistor Q2 is connected to a collector of the first discharge transistor Q1, and an emitter of the second discharge transistor Q2 is connected to the I/O pad. An emitter of the third discharge transistor Q3 is connected to the power pad VDD, and a base of the third discharge transistor Q3 is connected to a base of the first discharge transistor Q1. The first discharge unit 101 can form a second discharge path between the power pad VDD and the I/O pad when there is a negative electric pulse on the I/O pad, so that a positive charge on the power pad VDD flows to the I/O pad through the second discharge path to discharge a negative charge on the I/O pad. Specifically, the positive charge on the power pad VDD flows from the emitter of the first discharge transistor Q1 to the collector thereof, then flows from the collector of the first discharge transistor Q1 to the base of the second discharge transistor Q2, then flows from the base of the second discharge transistor Q2 to the emitter thereof, and flows from the emitter of the second discharge transistor Q2 to the I/O pad.

In some embodiments, the first discharge unit 101 further includes a first resistor R1 and a second resistor R2. A first end of the first resistor R1 is connected to the power pad VDD, and a second end of the first resistor R1 is connected to the collector of the second discharge transistor Q2. A first end of the second resistor R2 is connected to the collector of the first discharge transistor Q1, and a second end of the second resistor R2 is connected to the I/O pad. The first resistor R1 and the second resistor R2 are current limiting resistors and serve to protect the circuit.

The second discharge unit 102 includes a fourth discharge transistor Q4, a fifth discharge transistor Q5, and a bidirectional transistor BJT. An emitter of the fourth discharge transistor Q4 is connected to the I/O pad, a collector of the fifth discharge transistor Q5 is connected to a collector of the fourth discharge transistor Q4, and an emitter of the fifth discharge transistor Q5 is connected to the ground pad VSS. A first terminal of the bidirectional transistor BJT is connected to a base of the fourth discharge transistor Q4, and a second terminal of the bidirectional transistor BJT is connected to a base of the fifth discharge transistor Q5. The second discharge unit 102 can form a third discharge path from the I/O pad to the ground pad VSS when there is a positive electric pulse on the I/O pad, to discharge a positive charge on the I/O pad. Specifically, the positive charge on the I/O pad flows from the first terminal of the bidirectional transistor BJT to the second terminal thereof, then flows from the second terminal of the bidirectional transistor BJT to the base of the fifth discharge transistor Q5, then flows from the base of the fifth discharge transistor Q5 to the emitter thereof, and flows from the emitter of the fifth discharge transistor Q5 to the ground pad VSS. The second discharge unit 102 can further form a fourth discharge path from the ground pad VSS to the I/O pad when there is a negative electric pulse on the I/O pad, so that a positive charge on the ground pad VSS flows to the I/O pad through the fourth discharge path to discharge a negative charge on the I/O pad. Specifically, the positive charge on the ground pad VSS flows from the second terminal of the bidirectional transistor BJT to the first terminal thereof, then flows from the first terminal of the bidirectional transistor BJT to the base of the fourth discharge transistor Q4, then flows from the base of the fourth discharge transistor Q4 to the emitter thereof, and flows from the emitter of the fourth discharge transistor Q4 to the I/O pad.

In some embodiments, the second discharge unit 102 further includes a third resistor R3 and a fourth resistor R4. A first end of the third resistor R3 is connected to the I/O pad, and a second end of the third resistor R3 is connected to the first terminal of the bidirectional transistor BJT. A first end of the fourth resistor R4 is connected to the second terminal of the bidirectional transistor BJT, and a second end of the fourth resistor R4 is connected to the ground pad VSS. The third resistor R3 and the fourth resistor R4 are current limiting resistors and serve to protect the circuit.

A base of the bidirectional transistor BJT is connected to the base of the first discharge transistor Q1, and the second terminal of the bidirectional transistor BJT is further connected to the collector of the third discharge transistor Q3, to achieve electrical connection between the first discharge unit 101 and the second discharge unit 102. The first discharge unit 101 and the second discharge unit 102 which are electrically connected together can form a first discharge path from the I/O pad to the power pad VDD when there is a positive electric pulse on the I/O pad, to discharge a positive charge on the I/O pad to the power pad VDD. Specifically, the positive charge on the I/O pad flows from the first terminal of the bidirectional transistor BJT to the base thereof, and flows from the base of the bidirectional transistor BJT to the power pad VDD. The first discharge unit 101 and the second discharge unit 102 which are electrically connected together can further form a fifth discharge path from the power pad VDD to the ground pad VSS when there is an electrostatic pulse on the power pad VDD, to discharge an electrostatic charge on the power pad VDD to the ground pad VSS. Specifically, the electrostatic charge on the power pad VDD flows from the emitter of the third discharge transistor Q3 to the collector thereof, then flows from the collector of the third discharge transistor Q3 to the base of the fifth discharge transistor Q5, then flows from the base of the fifth discharge transistor Q5 to the emitter thereof, and flows from the emitter of the fifth discharge transistor Q5 to the ground pad VSS. The first discharge unit 101 and the second discharge unit 102 which are electrically connected together can further form a sixth discharge path from the ground pad VSS to the power pad VDD when there is an electrostatic pulse on the ground pad VSS, to discharge an electrostatic charge on the ground pad VSS to the power pad VDD. Specifically, the electrostatic charge on the ground pad VSS flows from the second terminal of the bidirectional transistor BJT to the base thereof, and flows from the base of the bidirectional transistor BJT to the power pad VDD.

As shown in FIG. 2 and FIG. 3, the ESD protection circuit further includes a trigger unit 103. The trigger unit 103 is connected between the I/O pad and the ground pad VSS. The trigger unit 103 includes a trigger terminal N. The trigger terminal N is connected to the base of the bidirectional transistor BJT, and is further connected to the base of the first discharge transistor Q1. The trigger unit 103 can generate a trigger signal when there is an electrostatic pulse on any of the pads, so that the first discharge unit 101 and/or the second discharge unit 102 discharge an electrostatic charge under the trigger of the trigger signal.

When there is a negative electric pulse on the I/O pad, the trigger unit 103 generates a first trigger signal. The first discharge transistor Q1 and the second discharge transistor Q2 are triggered to be turned on by the first trigger signal to form the second discharge path between the power pad VDD and the I/O pad, so that a positive charge on the power pad VDD flows to the I/O pad through the second discharge path to discharge a negative charge on the I/O pad.

In some embodiments, as shown in FIG. 3, the first discharge transistor Q1 is a PNP transistor, and the second discharge transistor Q2 is an NPN transistor. When there is a negative electric pulse on the I/O pad, a positive charge on the power pad VDD flows from the emitter of the first discharge transistor Q1 to the base thereof, and to the trigger terminal N of the trigger unit 103. Then, the trigger unit 103 generates the first trigger signal, and the first discharge transistor Q1 is triggered to be turned on by the first trigger signal. A collector current of the first discharge transistor Q1 triggers the second discharge transistor Q2 to be turned on. Thus, the second discharge path from the emitter of the first discharge transistor Q1 to the collector thereof and from the base of the second discharge transistor Q2 to the emitter thereof is formed.

When there is a positive electric pulse on the I/O pad, the first terminal of the bidirectional transistor BJT acts as an emitter. The bidirectional transistor BJT is triggered to be turned on by the positive electric pulse on the I/O pad to form the first discharge path from the I/O pad to the power pad VDD, so that a positive charge on the I/O pad is discharged to the power pad VDD through the first discharge path. The first discharge path passes through the third resistor R3, the emitter of the bidirectional transistor BJT to the base of the bidirectional transistor, and the first resistor R1.

When there is a positive electric pulse on the I/O pad, the trigger unit 103 generates a second trigger signal. The bidirectional transistor BJT and the fifth discharge transistor Q5 are triggered to be turned on by the second trigger signal, to form the third discharge path from the I/O pad to the ground pad VSS, so that a positive charge on the I/O pad is discharged to the ground pad VSS.

In some embodiments, the fifth discharge transistor Q5 is an NPN transistor, and the first terminal of the bidirectional transistor BJT is an emitter. When there is a positive electric pulse on the I/O pad, a positive charge on the I/O pad flows from the emitter of the bidirectional transistor BJT to the base thereof, and to the trigger terminal N of the trigger unit 103. The trigger unit 103 generates the second trigger signal, and the bidirectional transistor BJT is triggered to be turned on by the second trigger signal. A collector current of the bidirectional transistor BJT triggers the fifth discharge transistor Q5 to be turned on. A third resistor R3 is further connected between the I/O pad and the bidirectional transistor BJT, and the third resistor R3 is used to protect the trigger unit 103. Thus, the third discharge path passing through the third resistor R3, the emitter of the bidirectional transistor BJT to the collector thereof, and the base of the fifth discharge transistor Q5 to the emitter thereof is formed.

When there is a negative electric pulse on the I/O pad, the second terminal of the bidirectional transistor BJT acts as an emitter. The trigger unit 103 generates the third trigger signal, and the bidirectional transistor BJT and the fourth discharge transistor Q4 are triggered to be turned on by the third trigger signal to form a fourth discharge path from the ground pad VSS to the I/O pad, so that a positive charge on the ground pad VSS flows to the I/O pad to discharge a negative charge on the I/O pad.

In some embodiments, the fourth discharge transistor Q4 is an NPN transistor. When there is a negative electric pulse on the I/O pad, a positive charge on the ground pad VSS flows from the emitter of the bidirectional transistor BJT to the base thereof, and to the trigger terminal N of the trigger unit 103. The trigger unit 103 generates the third trigger signal, and the bidirectional transistor BJT is triggered to be turned on by the third trigger signal. A collector current of the bidirectional transistor BJT triggers the fourth discharge transistor Q4 to be turned on. A fourth resistor R4 is further connected between the ground pad VSS and the emitter of the bidirectional transistor BJT, and the fourth resistor R4 is used to protect the trigger unit 103. Thus, the fourth discharge path passing through the fourth resistor R4, the emitter of the bidirectional transistor BJT to the collector thereof, and the base of the fourth discharge transistor Q4 to the emitter thereof is formed.

When there is an electrostatic pulse on the power pad VDD, the trigger unit 103 generates a fourth trigger signal, and the third discharge transistor Q3 and the fifth discharge transistor Q5 are triggered to be turned on by the fourth trigger signal to form a fifth discharge path from the power pad VDD to the ground pad VSS, so that an electrostatic charge on the power pad VDD is discharged to the ground pad VSS.

In some embodiments, the third discharge transistor Q3 is a PNP transistor. When there is an electrostatic pulse on the power pad VDD, a positive charge on the power pad VDD flows from the emitter of the third discharge transistor Q3 to the base thereof and to the trigger terminal N of the trigger unit 103. The trigger unit 103 generates the fourth trigger signal, and the third discharge transistor Q3 is triggered to be turned on by the fourth trigger signal. A collector current of the third discharge transistor Q3 triggers the fifth discharge transistor Q5 to be turned on. Thus, the fifth discharge path passing through the emitter of the third discharge transistor Q3 to the collector thereof and the base of the fifth discharge transistor Q5 to the emitter thereof is formed.

When there is an electrostatic pulse on the ground pad VSS, the bidirectional transistor BJT is turned on to form a sixth discharge path from the ground pad VSS to the power pad VDD. The second terminal of the bidirectional transistor BJT is an emitter, and a positive charge on the ground pad VSS is discharged to the power pad VDD from the emitter of the bidirectional transistor BJT to the base thereof and through the first resistor R1.

In some embodiments, as shown in FIG. 3, the trigger unit 103 includes a cascade diode DS, a first diode D5, and a second diode D4. A positive terminal of the cascade diode DS acts as the trigger terminal N of the trigger unit 103. A positive terminal of the first diode D5 is connected to a negative terminal of the cascade diode DS, and a negative terminal of the first diode D5 is connected to the I/O pad. A positive terminal of the second diode D4 is connected to the negative terminal of the first diode D5, and a negative terminal of the second diode D4 is connected to the ground pad VSS. The cascade diode DS is used to adjust a trigger voltage of the trigger unit 103, and the first diode D5 and the second diode D4 are used to adjust a charge flow direction.

The cascade diode DS includes multiple third diodes. The multiple third diodes are connected in series, and a positive terminal of a third diode is connected to a negative terminal of a next third diode. A positive terminal of a third diode located at the head acts as the positive terminal of the cascade diode DS, and a negative terminal of a third diode located at the tail acts as the negative terminal of the cascade diode DS. Thus, the trigger voltage of the trigger unit 103 can be adjusted by adjusting the number of the third diodes.

Figure 4:
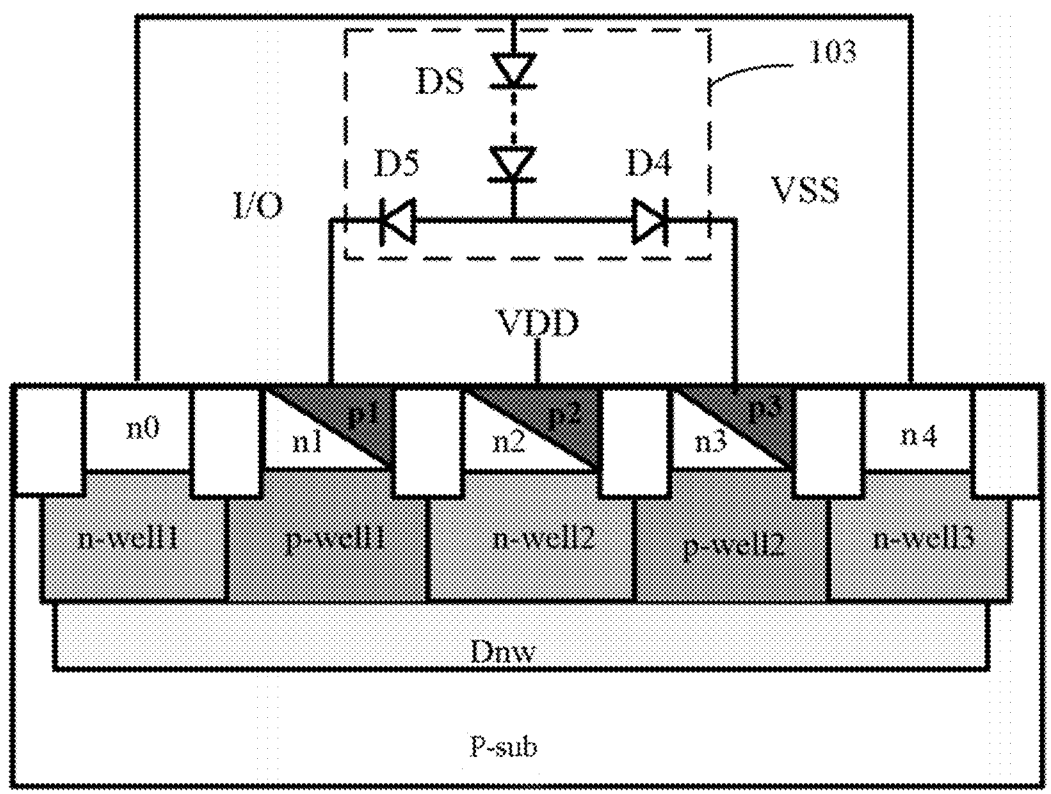
FIG. 4 is a cross-sectional view of a semiconductor structure of the ESD protection circuit according to the embodiment shown in FIG. 3.
Figure 5:
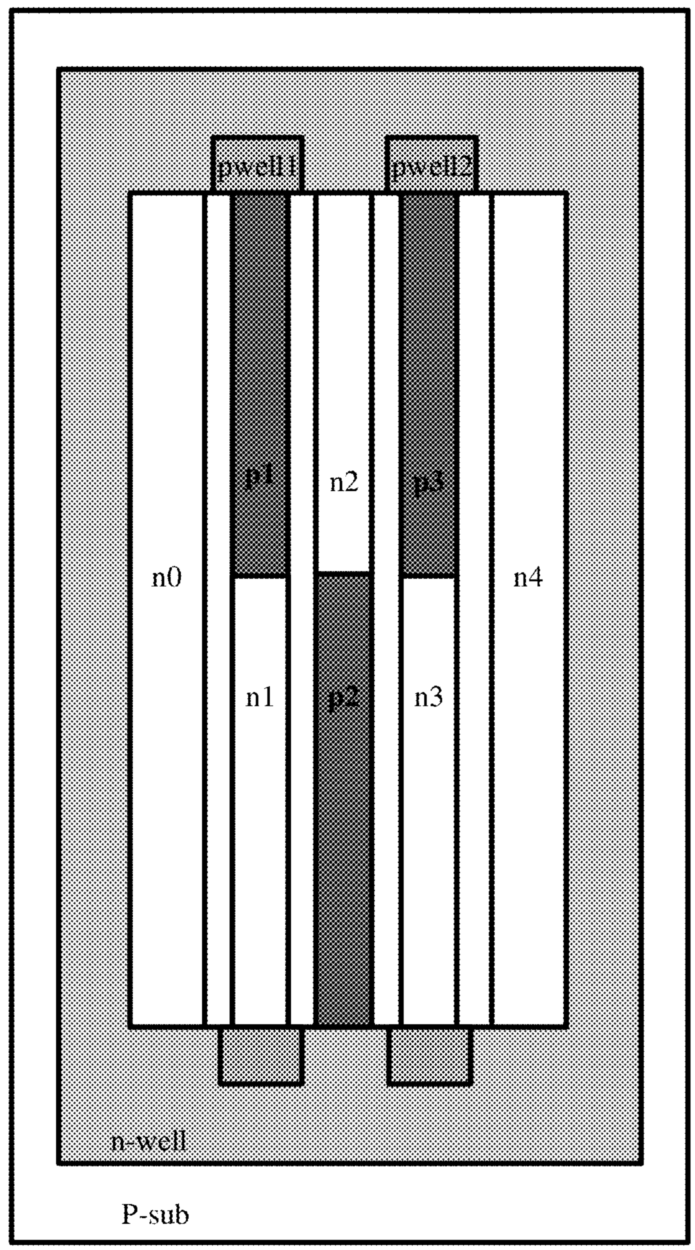
FIG. 5 is a top view of a semiconductor structure of the ESD protection circuit according to the embodiment shown in FIG. 3.

FIG. 4 is a cross-sectional view of a semiconductor structure of an ESD protection circuit in a chip according to an embodiment of the disclosure. FIG. 5 is a top view of the semiconductor structure. As shown in FIG. 4 and FIG. 5, an ESD protection circuit provided by an embodiment of the present disclosure includes a first discharge unit 101 and a second discharge unit 102. The first discharge unit 101 includes a first discharge transistor Q1, a second discharge transistor Q2, and a third discharge transistor Q3. The second discharge unit 102 includes a fourth discharge transistor Q4, a fifth discharge transistor Q5, and a bidirectional transistor BJT. The first discharge transistor Q1, the third discharge transistor Q3, and the bidirectional transistor BJT are PNP transistors. The second discharge transistor Q2, the fourth discharge transistor Q4, and the fifth discharge transistor Q5 are NPN transistors.

In a p-type semiconductor substrate p-sub, a deep n well (Dnw) is formed by n-type ion implantation, and n-type ion implantation is performed again at two sides of the deep n well Dnw and other positions of the p-sub to form an n-type lightly doped region with a shallower depth and partially connected to the deep n well Dnw at each of the two sides of the deep n well Dnw, and to form one or more other n-type lightly doped regions at the other positions of the p-sub. An implantation energy required for forming the deep n well Dnw is different from that required for forming the n-type lightly doped region. The energy required for forming the deep n well Dnw is high, and the energy required for forming the n-type lightly doped region is low. Multiple p-type lightly doped regions are formed in the p-sub between the deep n well Dnw and the other n-type lightly doped regions.

As shown in FIG. 4, an n-type lightly doped region n-well1 is formed at a first side of the deep n well Dnw, an n-type lightly doped region n-well3 is formed at a second side of the deep n well Dnw, and an n-type lightly doped region n-well2 is formed between the n-type lightly doped region n-well1 and the n-type lightly doped region n-well3. A p-type lightly doped region p-well1 is formed by implanting p-type ions into the p-sub between the n-type lightly doped region n-well1 and the n-type lightly doped region n-well2, and a p-type lightly doped region p-well2 is formed by implanting p-type ions into the p-sub between the n-type lightly doped region n-well2 and the n-type lightly doped region n-well3. Then, an n-type heavily doped region n0 is formed in the n-type lightly doped region n-well1, a p-type heavily doped region p1 and an n-type heavily doped region n1 are formed in the p-type lightly doped region p-well1, an n-type heavily doped region n2 and a p-type heavily doped region p2 are formed in the n-type lightly doped region n-well2, a p-type heavily doped region p3 and an n-type heavily doped region n3 are formed in the p-type lightly doped region p-well2, and an n-type heavily doped region n4 is formed in the n-type lightly doped region n-well3.

As shown in FIG. 5, the p-type heavily doped region p1 and the n-type heavily doped region n1 in the p-type lightly doped region p-well1 are located at two ends of the p-type lightly doped region p-well1, the n-type heavily doped region n2 and the p-type heavily doped region p2 in the n-type lightly doped region n-well2 are located at two ends of the n-type lightly doped region n-well2, and the p-type heavily doped region p3 and the n-type heavily doped region n3 in the p-type lightly doped region p-well2 are located at two ends of the p-type lightly doped region p-well2. Since the n-type lightly doped regions n-well1, n-well2, and n-well3 can be doped regions having the same ion concentration, FIG. 5 does not show clear boundaries among the three n-type lightly doped regions n-well1, n-well2, and n-well3, which are together shown as n-well. Moreover, in FIG. 5, the p-type heavily doped region p1, the n-type heavily doped region n2, and the p-type heavily doped region p3 are located at one end, and the n-type heavily doped region n1, the p-type heavily doped region p2, and the n-type heavily doped region n3 are located at the other end.

As shown in FIG. 4, the n-type heavily doped region n2 and the p-type heavily doped region p2 are connected to the power pad VDD, the n-type heavily doped region n1 and the p-type heavily doped region p1 are connected to the I/O pad, the n-type heavily doped region n3 and the p-type heavily doped region p3 are connected to the ground pad VSS, and the positive terminal of the cascade diode DS is connected to the n-type lightly doped region n0 and the n-type lightly doped region n4.

The p-type heavily doped region p2 acts as an emitter region of the first discharge transistor Q1, the n-type lightly doped region n-well2 acts as a base region of the first discharge transistor Q1, the p-type heavily doped region p1 is connected to the p-type lightly doped region p-well1 and the n-type lightly doped region n-well2, and the p-type heavily doped region p1 acts as a collector region of the first discharge transistor Q1. The n-type heavily doped region n1 acts as an emitter region of the second discharge transistor Q2, the n-type heavily doped region n1 is connected to the p-type lightly doped region p-well1, the p-type lightly doped region p-well1 acts as a base region of the second discharge transistor Q2, the p-type lightly doped region p-well1 is connected to the n-type lightly doped region n-well2 and the n-type heavily doped region n2, and the n-type heavily doped region n2 acts as a collector region of the second discharge transistor Q2. The p-type heavily doped region p2 acts as an emitter region of the third discharge transistor Q3, the n-type lightly doped region n-well2 acts as a base region of the third discharge transistor Q3, the n-type lightly doped region n-well2 is connected to the p-type lightly doped region p-well2 and the p-type heavily doped region p3, and the p-type heavily doped region p3 acts as a collector region of the third discharge transistor Q3. The n-type heavily doped region n1 acts as an emitter region of the fourth discharge transistor Q4, the p-type lightly doped region p-well1 acts as a base region of the fourth discharge transistor Q4, the n-type heavily doped region n0 is connected to the n-type lightly doped region n-well1 and the p-type lightly doped region p-well1, and the n-type heavily doped region n0 acts as a collector region of the fourth discharge transistor Q4. The n-type heavily doped region n3 acts as an emitter region of the fifth discharge transistor Q5, the p-type lightly doped region p-well2 acts as a base region of the fifth discharge transistor Q5, the p-type lightly doped region p-well2 is connected to the n-type lightly doped region n-well3 and the n-type heavily doped region n4, and the n-type heavily doped region n4 acts as a collector region of the fifth discharge transistor Q5. The p-type heavily doped region p1 acts as the first terminal of the bidirectional transistor BJT, the n-type heavily doped region n0 acts as a base region of the bidirectional transistor BJT, and the p-type heavily doped region p3 acts as the second terminal of the bidirectional transistor BJT.

In the above technical solutions, the ESD protection circuit includes a discharge unit, and the discharge unit can discharge an electrostatic charge when there is an electrostatic pulse on any of the power pad, the ground pad and the I/O pad. The discharge unit occupies a small area in the chip and a chip cost is reduced. Moreover, when the electrostatic charge on any of the pads is discharged through the discharge unit, the discharge path is short, thereby improving the robustness.

Further, it should be noted that the modules or units in the electrostatic discharge protection circuit according to the embodiments of the disclosure, for example, the discharge unit, the first discharge unit, the second discharge unit and the trigger unit can be implemented by circuits.

It should be understood that the disclosure is not limited to the precise structures described above and illustrated in the accompanying drawings, and that various modifications and changes may be made without departing from the scope of the disclosure. The scope of the disclosure is limited only by the appended claims.

What is claimed is:

1. An electrostatic discharge protection circuit in a chip, wherein the chip comprises a power pad, a ground pad, and an input/output (I/O) pad, and the electrostatic discharge protection circuit comprises:

a discharge unit, connected to the power pad, the ground pad, and the I/O pad, wherein the discharge unit is configured to discharge an electrostatic charge when an electrostatic pulse appears on any of the power pad, the ground pad, and the I/O pad; and the discharge unit comprises a first discharge unit and a second discharge unit, the first discharge unit is connected to the second discharge unit, the power pad, and the I/O pad, and the second discharge unit is connected to the ground pad and the I/O pad, wherein the first discharge unit comprises:

a first discharge transistor having an emitter connected to the power pad;

a second discharge transistor having a base connected to a collector of the first discharge transistor and an emitter connected to the I/O pad; and a third discharge transistor having an emitter connected to the power pad and a base connected to a base of the first discharge transistor.

2. The electrostatic discharge protection circuit of claim 1, wherein the first discharge unit further comprises:

a first resistor having a first end connected to the power pad and a second end connected to a collector of the second discharge transistor; and a second resistor having a first end connected to the collector of the first discharge transistor and a second end connected to the I/O pad.

3. Is amended to recite: The electrostatic discharge protection circuit of claim 1, wherein the second discharge unit comprises:

a fourth discharge transistor having an emitter connected to the I/O pad;

a fifth discharge transistor having an emitter connected to the ground pad and a collector connected to a collector of the fourth discharge transistor; and a bidirectional transistor having a first terminal connected to a base of the fourth discharge transistor and a second terminal connected to a base of the fifth discharge transistor.

4. The electrostatic discharge protection circuit of claim 3, wherein the second discharge unit further comprises:

a third resistor having a first end connected to the I/O pad and a second end connected to the first terminal of the bidirectional transistor; and a fourth resistor having a first end connected to the second terminal of the bidirectional transistor and a second end connected to the ground pad.

5. The electrostatic discharge protection circuit of claim 3, wherein a base of the bidirectional transistor is connected to the base of the first discharge transistor, and a collector of the third discharge transistor is connected to the second terminal of the bidirectional transistor.

6. The electrostatic discharge protection circuit of claim 3, further comprising:

a trigger unit, connected between the I/O pad and the ground pad, wherein a trigger terminal of the trigger unit is connected to a base of the bidirectional transistor, and the trigger terminal is further connected to the base of the first discharge transistor.

7. The electrostatic discharge protection circuit of claim 6, wherein the trigger unit is configured to generate a first trigger signal when a negative electric pulse appears on the I/O pad; and the first discharge transistor and the second discharge transistor are triggered to be turned on by the first trigger signal to form a second discharge path between the power pad and the I/O pad.

8. The electrostatic discharge protection circuit of claim 6, wherein the trigger unit is configured to generate a second trigger signal when a positive electric pulse appears on the I/O pad; and the bidirectional transistor and the fifth discharge transistor are triggered to be turned on by the second trigger signal to form a third discharge path from the I/O pad to the ground pad.

9. The electrostatic discharge protection circuit of claim 6, wherein the second terminal of the bidirectional transistor acts as an emitter;

the trigger unit is further configured to generate a third trigger signal when a negative electric pulse appears on the I/O pad; and the bidirectional transistor and the fourth discharge transistor are triggered to be turned on by the third trigger signal to form a fourth discharge path from the ground pad to the I/O pad.

10. The electrostatic discharge protection circuit of claim 6, wherein the trigger unit is further configured to generate a fourth trigger signal when an electrostatic pulse appears on the power pad; and the third discharge transistor and the fifth discharge transistor are triggered to be turned on by the fourth trigger signal to form a fifth discharge path from the power pad to the ground pad.

11. The electrostatic discharge protection circuit of claim 6, wherein the trigger unit comprises:

a cascade diode having a positive terminal used as the trigger terminal of the trigger unit;

a first diode having a negative terminal connected to the I/O pad and a positive terminal connected to a negative terminal of the cascade diode; and a second diode having a positive terminal connected to the negative terminal of the first diode and a negative terminal connected to the ground pad.

12. The electrostatic discharge protection circuit of claim 11, wherein the cascade diode comprises a plurality of third diodes; and a positive terminal of a third diode is connected to a negative terminal of a next third diode, a positive terminal of a third diode located at a head acts as a positive terminal of the cascade diode, and a negative terminal of a third diode located at a tail acts as the negative terminal of the cascade diode.

13. The electrostatic discharge protection circuit of claim 3, wherein the first discharge transistor, the third discharge transistor, and the bidirectional transistor are PNP transistors; and the second discharge transistor, the fifth discharge transistor, and the fourth discharge transistor are NPN transistors.

14. The electrostatic discharge protection circuit of claim 3, wherein the first terminal of the bidirectional transistor acts as an emitter of the bidirectional transistor when a positive electric pulse appears on the I/O pad;

the bidirectional transistor is triggered to be turned on by the positive electric pulse on the I/O pad, to form a first discharge path from the I/O pad to the power pad; and the first discharge path passes through a third resistor, the emitter of the bidirectional transistor to a base of the bidirectional transistor, and a first resistor.

15. The electrostatic discharge protection circuit of claim 3, wherein when an electrostatic pulse appears on the ground pad, the bidirectional transistor is turned on to form a sixth discharge path between the ground pad and the power pad.

* * * * *